United States Patent
Shirazi et al.

(10) Patent No.: US 11,953,566 B2
(45) Date of Patent: Apr. 9, 2024

(54) APPARATUS AND METHODS FOR VIRTUALLY LINEAR AND TEMPERATURE-INDEPENDENT SENSING OF MAGNETIC FIELDS

(71) Applicant: The United States of America, as represented by the Secretary of the Navy, Crane, IN (US)

(72) Inventors: Paymon Shirazi, Corona, CA (US); Subrata Sanyal, Eastvale, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 124 days.

(21) Appl. No.: 17/895,407

(22) Filed: Aug. 25, 2022

(65) Prior Publication Data
US 2024/0069125 A1    Feb. 29, 2024

(51) Int. Cl.
*G01R 33/09*    (2006.01)
(52) U.S. Cl.
CPC .................... *G01R 33/09* (2013.01)
(58) Field of Classification Search
CPC ...................................... G01R 33/09
See application file for complete search history.

(56) References Cited

U.S. PATENT DOCUMENTS 9,017,474 B2 *    4/2015    Geim .................... C01B 32/194
106/287.28

OTHER PUBLICATIONS

Sagar, Rizwan Ur Rehman et al., Defect-Induced, Temperature-Independent, Tunable Magnetoresistance of Partially Fluorinated Graphene Foam, Carbon journal, Mar. 2019, pp. 179-188, vol. 143, Elsevier Ltd.

* cited by examiner

*Primary Examiner* — Alesa Allgood
(74) *Attorney, Agent, or Firm* — Naval Surface Warfare Center, Crane Divison; Patrick Law

(57) ABSTRACT

Disclosed are apparatus and methods for sensing and measurement of magnetic fields that are insensitive to temperature, and respond linearly to the magnitude of the magnetic field. In particular, the apparatus and methods include the use of a resistance network including at least one fluorinated graphene foam (FGF) magnetoresistive device. Measurement of a voltage drop across at least one FGF magnetoresistive device is correlated to either merely the presence of a magnetic field or for measurement of at least a scalar magnitude value of the magnetic field. The use of FGF affords both temperature-insensitivity and linear magnetic field responsivity.

16 Claims, 8 Drawing Sheets

APPARATUS AND METHODS FOR VIRTUALLY LINEAR AND TEMPERATURE-INDEPENDENT SENSING OF MAGNETIC FIELDS

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200608US02) is assigned to the United States Government and is available for licensing for commercial purposes. Licensing and technical inquiries may be directed to the Technology Transfer Office, Naval Surface Warfare Center Corona, e-mail address: CRNA_CTO@navy.mil.

FIELD

The present invention relates to apparatus and methods for sensing and measuring magnetic fields, and more particularly to magnetic field sensing apparatus and methods that are both virtually linear and temperature-insensitive for sensing and measuring the magnitude of the magnetic field (i.e., the scalar component of the magnetic flux density $\vec{B}$).

BACKGROUND

Systems producing and utilizing magnetic fields include electromagnetic launchers (EMLs), coil guns, or similar technologies where electrical current is used to generate a magnetic field, $\vec{B}$ governed by Ampere's Law, to propel a projectile/armature. With the recent employment of EMLs within the U.S. Armed Forces, there is a high priority need for magnetic field metrology (which can be complex and is presently underserved) to determine the efficiency of such systems. Efficiency is used as a metric to characterize EMLs by directly measuring the scalar component of the magnetic field using a magnetic field sensor (e.g., a magnetometer). To date, non-metallic magnetic materials such as colossal magnetoresistance (CMR) and magneto-optical (MO) materials have been utilized as sensors to profile the extremely high magnetic fields generated by EMLs.

CMR and MO sensors respond non-linearly with respect to the magnitude of the magnetic field and exhibit temperature dependencies. EMLs, however, produce large magnetic fields and generate a substantial amount of heat due to the internal electrical resistance of the wiring/rails and friction between the armature and the rails/tube of the launcher. This is problematic as CMR and MO sensors are prone to rapid fluctuation during measurements due to temperature changes. Therefore, for applications such as EMLs, as well as for a host of other applications, a linear and temperature-independent magnetic field sensing mechanism would be beneficial to more accurately sense, measure, and/or profile the magnetic field.

SUMMARY

According to an illustrative embodiment of the present disclosure, a magnetic field sensor is disclosed. The sensor includes a resistance network including at least one fluorinated graphene foam (FGF) magnetoresistive device, an input configured to couple a voltage source to the resistance network, and an output coupled to the resistance network and configured to allow measurement of a voltage drop across at least the at least one FGF magnetoresistive device that can be correlated to at least one of a presence of a magnetic field or a scalar magnitude value of the magnetic field.

According to another illustrative embodiment of the present disclosure, a magnetic field sensor is disclosed including a resistance network having a first resistance and a second resistance coupled in series at a first node, and a third resistance and a fluorinated graphene foam (FGF) coupled in series at a second node. The first and second resistances in series are coupled in parallel with the third resistance and the FGF in series at third and fourth nodes. Further, the sensor includes an input configured to couple a voltage source across the third and fourth nodes, and an output coupling configured to couple the first and second nodes to an output.

Additional features and advantages of the present disclosure will become apparent to those skilled in the art upon consideration of the following detailed description of the illustrative embodiment including exemplifying a best mode of carrying out the invention as presently perceived.

BRIEF DESCRIPTION OF THE DRAWINGS

The detailed description of the drawings particularly refers to the accompanying figures in which.

DETAILED DESCRIPTION

The embodiments of the invention described herein are not intended to be exhaustive or to limit the invention to precise forms disclosed. Rather, the embodiments selected for description have been chosen to enable one skilled in the art to practice the invention.

As discussed above, CMR and MO magnetoresistance sensors or magnetometers have drawbacks in that they are temperature-dependent and do not exhibit a linear relationship between the magnetoresistance of the sensor and the magnitude of the magnetic field being measured. These drawbacks become particularly acute in applications such as EMLs where large electric currents result in high temperatures due to internal Ohmic losses and mechanical friction in such devices. The present disclosure provides apparatus and methods using fluorinated graphene foam (FGF) as magnetoresistance sensors (instead of CMR and MO sensors), which provides superior capabilities for the magnetic field metrology of EMLs due to their virtually temperature-independent and almost linear relationship with the magnitude of the magnetic field. FGF sensors intrinsically offer higher accuracy with dependency on one variable (i.e., the magnitude of the magnetic flux density field "$\|\vec{B}\|$") rather than two variables (i.e., $\|\vec{B}\|$ and temperature T). FGF magnetoresistance sensors offer a novel solution for magnetic field metrology in EMLs, as well as in other devices and environments, with simple and low cost calibration supported by direct measurement traceability to the primary measurement standards of the National Institute of Standards and Technology (NIST).

Figure 1:
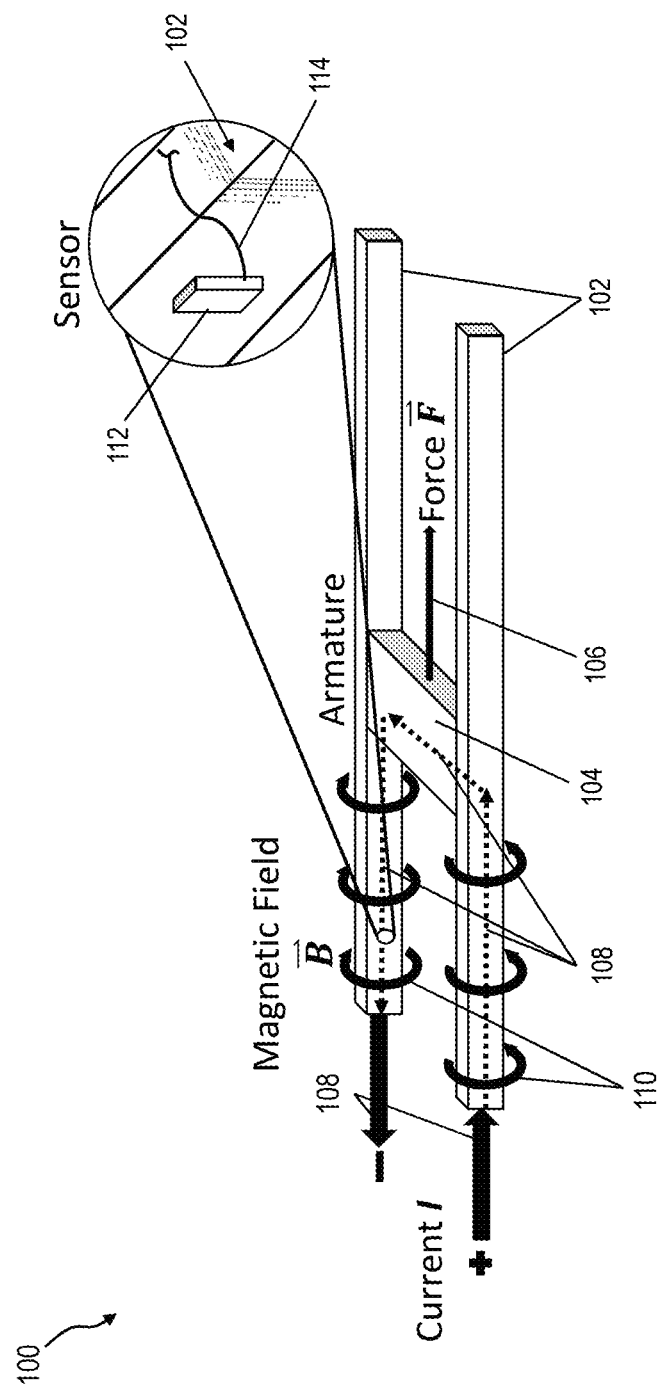
FIG. 1 shows an exemplary application of a magnetic field sensing apparatus in an electromagnetic launcher according to aspects of the present disclosure.

Turning to the drawings, FIG. 1 shows an exemplary application of a magnetic field sensing apparatus in an electromagnetic launcher (EML) according to aspects of the present disclosure. The illustrated system 100 includes a plurality of rails 102 and an armature 104 between the rails that travels in the direction of the Lorentz force 106 (i.e., $\vec{F}=q(\vec{E}+\vec{v}\times\vec{B})$ where $\vec{F}$ is force vector, q is the electric charge, $\vec{E}$ is the electric field vector, $\vec{v}$ is the velocity vector, and $\vec{B}$ is the magnetic field vector) acting on the armature 104. The magnetic field results from passing an electric current I 108 (the rate of flow of charge, i.e., I=q/t where t is the time) through the rails 102 and the armature 104, where the current 108 also generates or engenders a magnetic field $\vec{B}$ 110 as quantified by Ampere's Circuital Law (i.e., $\oint_C \vec{B} \cdot \vec{dl} = \mu_0 I_{enclosed}$, where $\vec{dl}$ is the infinitesimal element of the curve C and tangent to the curve, $\mu_0$ is the permeability of free space [also known as the magnetic constant], and $I_{enclosed}$ is the current through a surface enclosed by the curve C). The current 108 produces a magnetic field $\vec{B}$ (illustrated by arcuate arrows 110), and heat due the internal electrical resistance of the rails 102 and the armature 104. Additionally, heat is generated due to kinetic friction resulting from the travel of armature 104 along the rails 102. Accordingly, if the magnitude of $\vec{B}$ 110 is measured, both electrical and mechanical losses (e.g., the efficiency of the EML) can be determined knowing the energy input to the system 100 (supplied electrical current I).

For measuring or sensing the magnetic field $\vec{B}$, FIG. 1 further illustrates an expanded view of a magnetic field sensor 112, which is constructed in accordance with the present disclosure. In the example of FIG. 1, the sensor 112 may be mounted to one of the rails 102 for sensing and measuring the magnetic field 110, such as on a surface of the rail 102 as illustrated. In further aspects, one or more sensors 112 may be placed within threaded and pre-tapped holes at various positions along the rails 102. The sensor 112 may further include a coupling cable 114 that supplies voltage to the sensor 112 as well as returns output voltages/currents to be measured and correlated to the magnetic field magnitude.

According to aspects of the present disclosure, the magnetic field sensor 112 includes a fluorinated graphene foam (FGF) as the magnetoresistive element that changes resistance proportional to the magnitude of the magnetic field $\vec{B}$.

Figure 2:
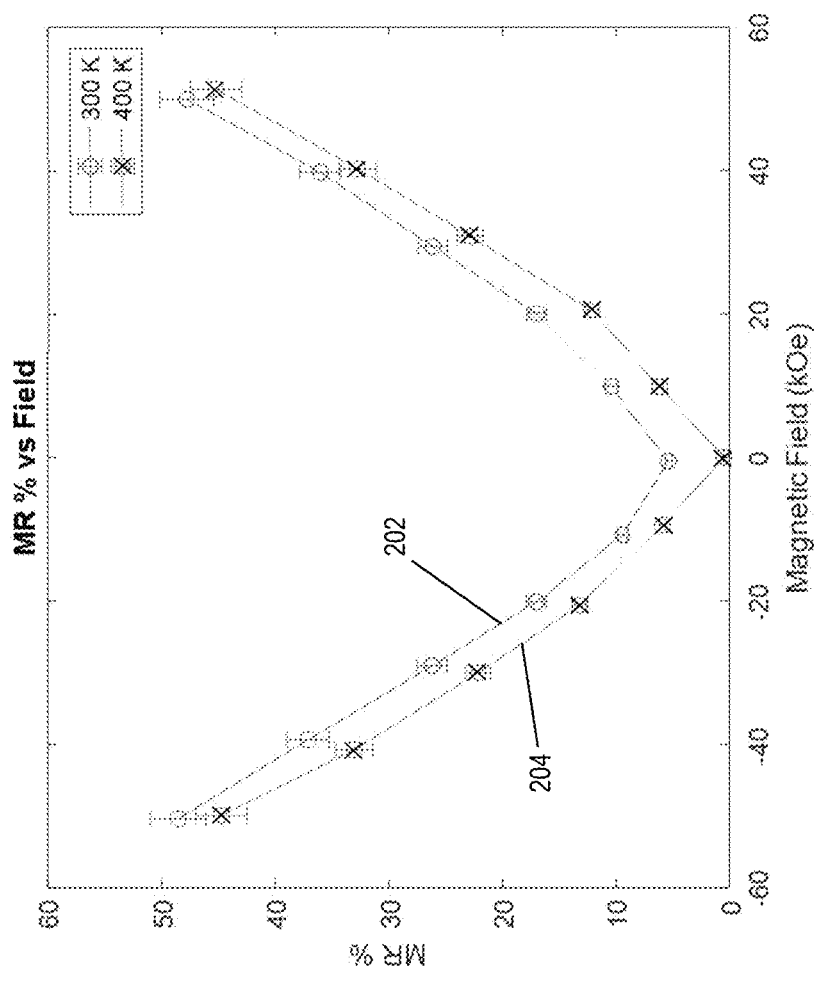
FIG. 2 illustrates an exemplary plot of a magnetoresistance percentage of a fluorinated graphene foam (FGF) over the intensity of a magnetic field according to aspects of the present disclosure.

As an example of this relationship, FIG. 2 illustrates a graph 200 showing the percentage of the magnetoresistance (MR %) of FGF at various magnetic field $\vec{B}$ strengths expressed in units of kilo-Oerstead (kOe) (note: kOe is the centimetre-gram-second (CGS) unit for magnetic fields $\vec{H}$ and related to the corresponding $\vec{B}$ SI unit Tesla by a factor of $\vec{B}(Tesla)=\mu_r^{air} \vec{H}(kOe)\times 10^1$, where $\mu_r^{air}=1$). As seen in graph 200, the relationship of the MR % to the magnetic field strength is essentially or virtually linear. Of note, the MR % may be calculated according to the relationship $$MR \% = \left(\frac{R(\|\vec{B}\|)}{R_0} - 1\right) \times 100\%,$$

where $R(\|\vec{B}\|)$ is the resistance in the presence of a magnetic field and $R_0$ is the resistance in the absence of the magnetic field.

Furthermore, the two curves shown 202 and 204 represent the relationship between MR % and magnetic field strength at the temperatures 300 Kelvin (i.e., near room temperature) and 400 Kelvin, respectively. As may be seen in FIG. 2, the behavior of the curves 202 and 204 stay essentially linear (albeit with an offset there between) regardless of temperature, i.e., the virtually linear magnetic responsivity of the magnetoresistance of the FGF material is also essentially or virtually temperature independent.

Figure 3:
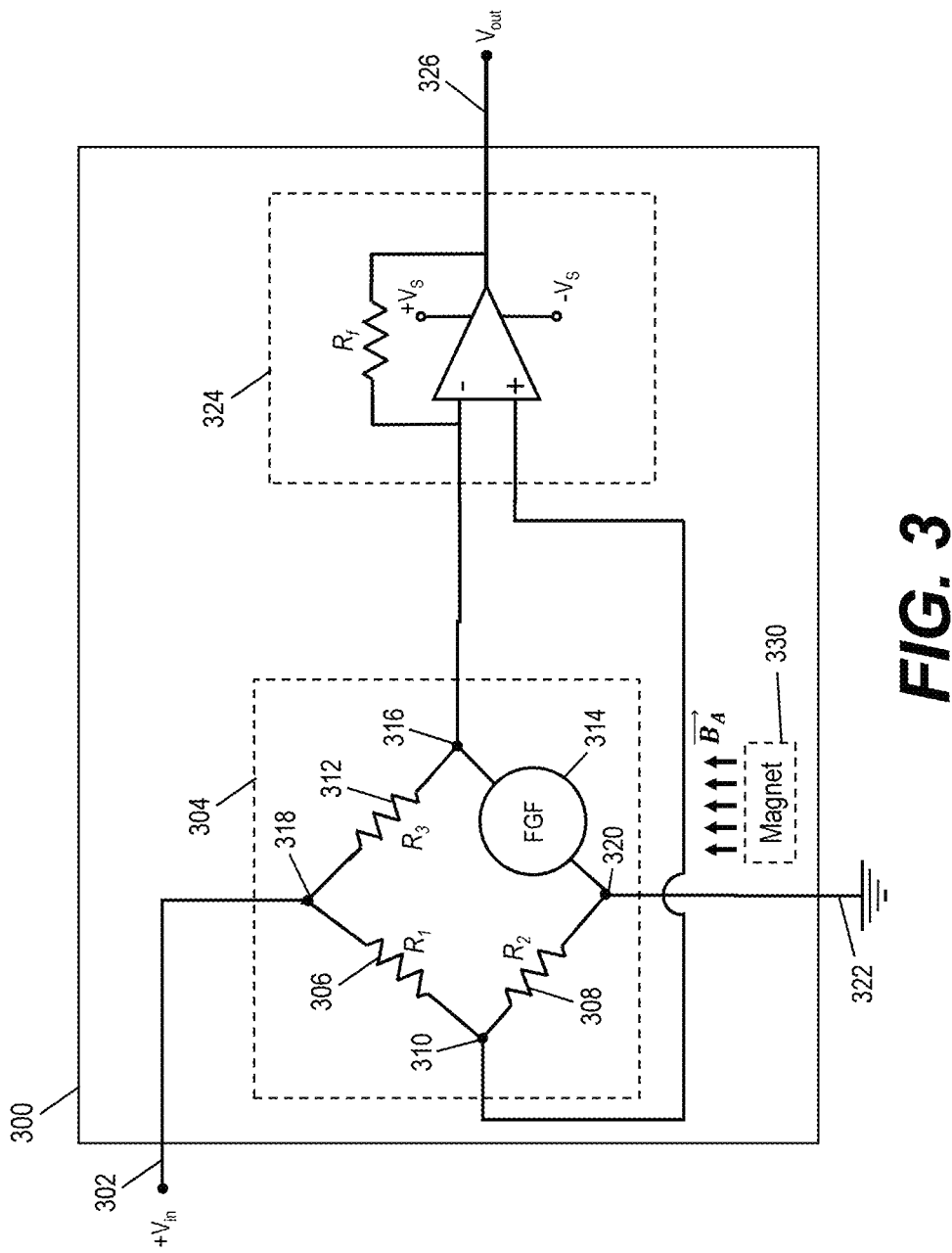
FIG. 3 shows an exemplary electrical schematic diagram of a magnetic field sensing apparatus according to aspects of the present disclosure.

FIG. 3 illustrates one example of a magnetic field sensor 300 that may be implemented as sensor 112, for example. As shown, the magnetic field sensor 300 includes an input 302 receiving an input voltage $V_{in}$, which may be a DC voltage. The voltage at input 302 is coupled or supplied to a resistance or resistor network 304 that is arranged in a Wheatstone bridge configuration in this particular example, but is not limited to such. The network 304 includes a first resistance 306 and a second resistance 308 coupled in series at a first node 310, which is also an output node of the network 304. Further, network 304 includes a third resistance 312 and a fluorinated graphene foam (FGF) 314 coupled in series at a second node 316, which is another output node for the resistance network 304. The first and second resistances in series 306, 308 are coupled in parallel with the third resistance and the FGF in series 312, 314 at third and fourth nodes 318 and 320, which are connected to the input voltage 302 and ground 322, respectively. Accordingly, a differential voltage between nodes 310 and 316 will vary as the resistance of FGF 314 varies due to the effects of a magnetic flux density field in which the sensor 300 is placed (i.e., the voltage drop will change due to the magnetoresistance change of the FGF).

The nodes 310 and 316 may be coupled to a differential amplifier 324, which serves to amplify the differential voltage between the nodes 310 and 316 and output the amplified voltage difference at output 326. It is noted that amplifier 324 may be implemented as a low noise differential with an operational amplifier as shown or equivalents thereof. In the configuration of FIG. 3, the sensor 300 is thus configured to allow measurement of a voltage drop across at least the FGF 314 based on the differential voltage change across nodes 310 and 316 that is correlated to the presence and/or magnitude of the magnetic field. Of note, in some examples the input voltage $V_{in}$ 302 may be the same voltage source used to supply the positive voltage supply $+V_s$ of the amplifier 324 (along with the negative voltage −V$_s$ of the same voltage value (but negative) for supplying/driving the amplifier 324).

Figure 4:
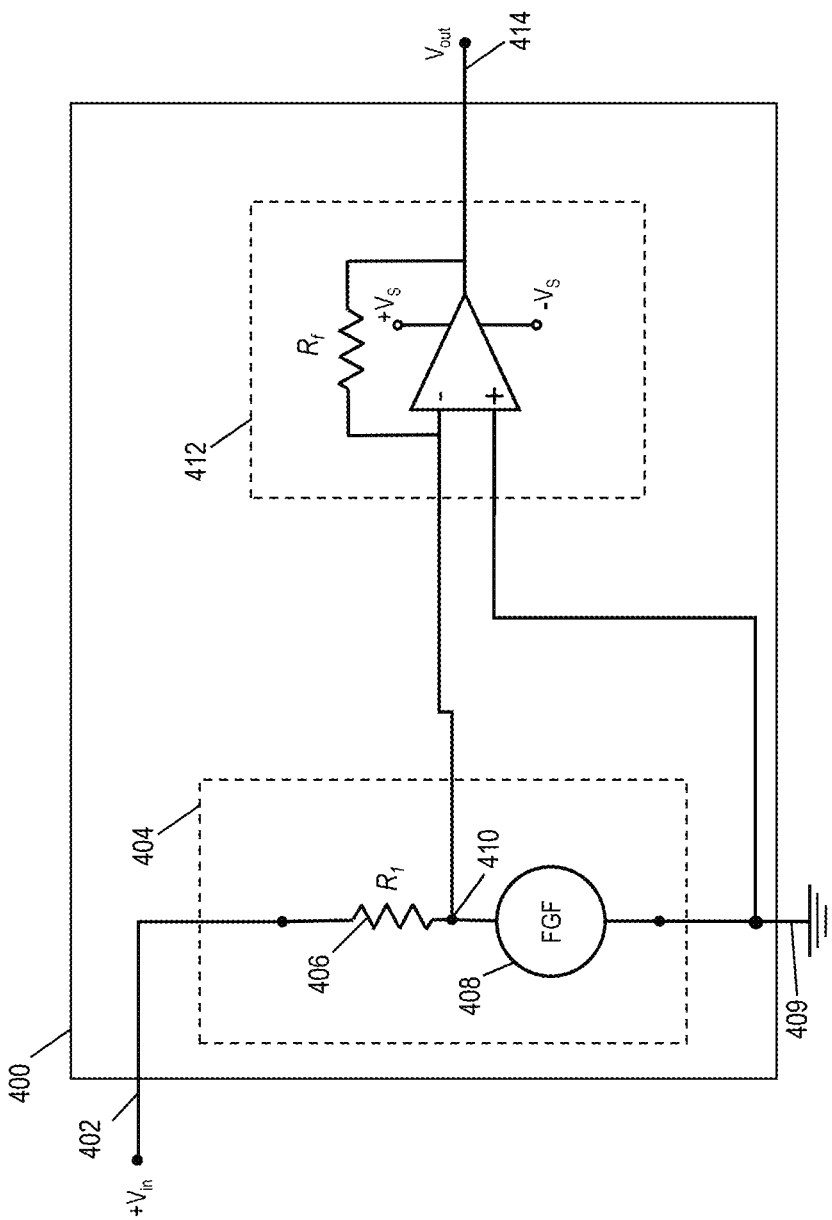
FIG. 4 shows another exemplary electrical schematic diagram of another magnetic field sensing apparatus according to aspects of the present disclosure.

FIG. 4 illustrates an example of another magnetic field sensor 400 that may be implemented as sensor 112. As shown, the magnetic field sensor 400 includes an input 402 receiving an input voltage V$_{in}$, which may be a DC voltage. The input 402 is coupled to a resistance or resistor network 404 that is arranged in a voltage divider configuration in this particular example, but is not limited to such. The network 404 includes a first resistance 406 and a fluorinated graphene foam (FGF) 408 coupled in series between voltage 402 and ground 409. The resistance 406 and FGF 408 are coupled at a node 410, which is an output node as well. Accordingly, as the magnetoresistance of FGF 409 changes, the voltage level at node 410 will change and this voltage change may be correlated to a magnitude of the magnetic field (or more simply correlated to detecting the presence of a magnetic field). The voltage at node 410 may be input to an amplifier 412, which amplifies the voltage at 410 and outputs an amplified voltage 414. It is noted that amplifier 412 may be implemented with an operational amplifier as shown or equivalents thereof. In the configuration of FIG. 4, the senor 400 is thus configured to allow measurement of a voltage drop across at least the FGF 408, which is correlated to the presence and/or magnitude of the magnetic field.

Figure 5:
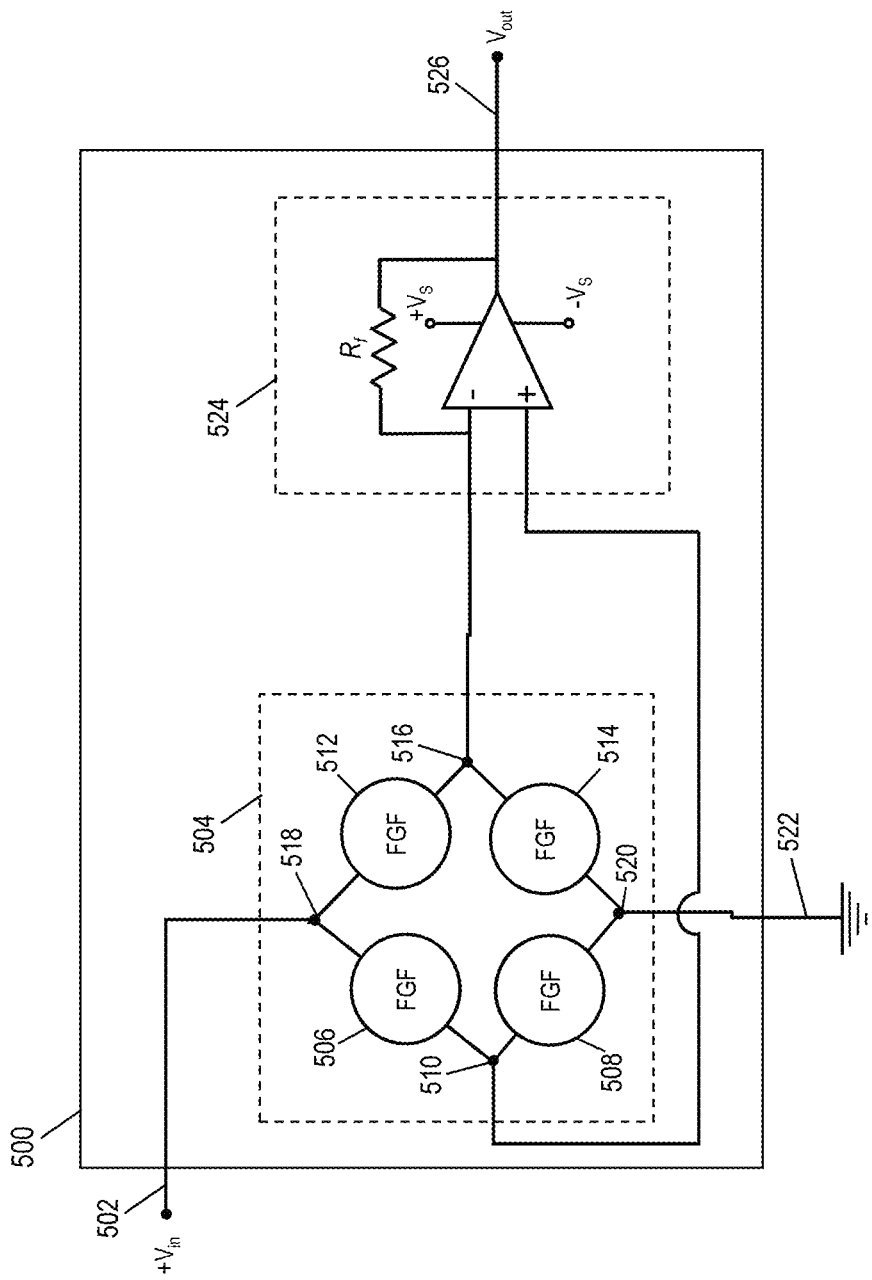
FIG. 5 shows yet another exemplary electrical schematic diagram of another magnetic field sensing apparatus according to aspects of the present disclosure.

FIG. 5 illustrates yet another example of a magnetic field sensor 500 that may be implemented as sensor 112, for example. As shown, the magnetic field sensor 500 includes an input 502 receiving an input voltage V$_{in}$, which may be a DC voltage. The input 502 is coupled to a resistance network 504 that includes one or more FGF magnetoresistive devices. The example of FIG. 5 shows four FGF device that are arranged in a Wheatstone bridge configuration example, but the disclosure is not limited to such. For example, the resistance network 504 may include two FGF devices in a voltage divider configuration similar to the circuitry illustrated in FIG. 4.

The resistance network 504 illustrated in FIG. 5 includes a first FGF device 506 and a second FGF device 508 coupled in series at a first node 510, which is also an output node of the network 504. Further, network 504 includes a third FGF device 512 and a fourth FGF device 514 coupled in series at a second node 516, which is another output node for the resistance network 504. The first and second FGF devices in series 506, 508 are coupled in parallel with the third and fourth FGF devices in series 512, 514 at third and fourth nodes 518 and 520, which are connected to the input 502 (e.g., voltage V$_{in}$) and ground 522, respectively. Accordingly, a differential voltage between nodes 510 and 516 will vary as the resistances of the FGF devices 506, 508, 512, and/or 514 vary due to the effects of a magnetic flux density field in which the sensor 500 is placed (i.e., the voltage drop will change due to the magnetoresistance change of the FGF devices).

The nodes 510 and 516 may be coupled to a differential amplifier 524, which serves to amplify the differential voltage between the nodes 510 and 516 and output the amplified voltage difference at output 526. It is noted that amplifier 524 may be implemented as a low noise differential with an operational amplifier as shown or equivalents thereof. In the configuration of FIG. 5, the sensor 500 is thus configured to allow measurement of the differential voltage change across nodes 510 and 516 that is correlated to the presence and/or magnitude of the magnetic field. Of note, in some examples the input voltage V$_{in}$ at input 502 may be the same voltage source used to supply the positive voltage supply +V$_s$ of the amplifier 524 (along with the negative voltage −V$_s$ of the same voltage value (but negative) for supplying/driving the amplifier 524).

Of further note, while the examples of FIGS. 3-5 disclose magnetic sensing apparatus that derive a scalar value measurement of the magnetic field, these apparatus may also be configured sense a vector quantity of the magnetic field by supplying one or more additional or secondary magnetic fields in any axis (e.g., x, y, and/or z axes). In an embodiment, the secondary magnetic field(s) may be of higher magnitude than the field(s) being measured but is not limited to such and is based on design. The external field may be applied outside of the sensor or a die housing the sensor (examples of which will be discussed in connection with FIGS. 6 and 7 below), or within the die in other examples. In one example, the additional magnetic field(s) could be supplied by permanent magnets (e.g., Neo N52 magnets with supplying magnetic fields up to 1.4 Tesla) that are fabricated within the die (or, alternatively placed proximate to the die, but external therefrom). As an illustration, FIG. 3 shows an alternative magnet or magnetic field source 330 within the sensor apparatus 300 for supplying this secondary magnetic field $\vec{B_A}$ to enable measurement of magnetic field vector quantities. In another example, super high-temperature conducting magnets may be utilized, particularly in cases where very large magnetic fields are being sensed (e.g., greater than 10 Tesla). Additionally, the secondary magnetic field, in some aspects, has an intensity, magnitude or value less than the magnetic field being sensed or measured. As those skilled in the art will appreciate, the magnetic field source 330 could be utilized with the sensors 400 or 500 in FIGS. 4 and 5.

Figure 6:
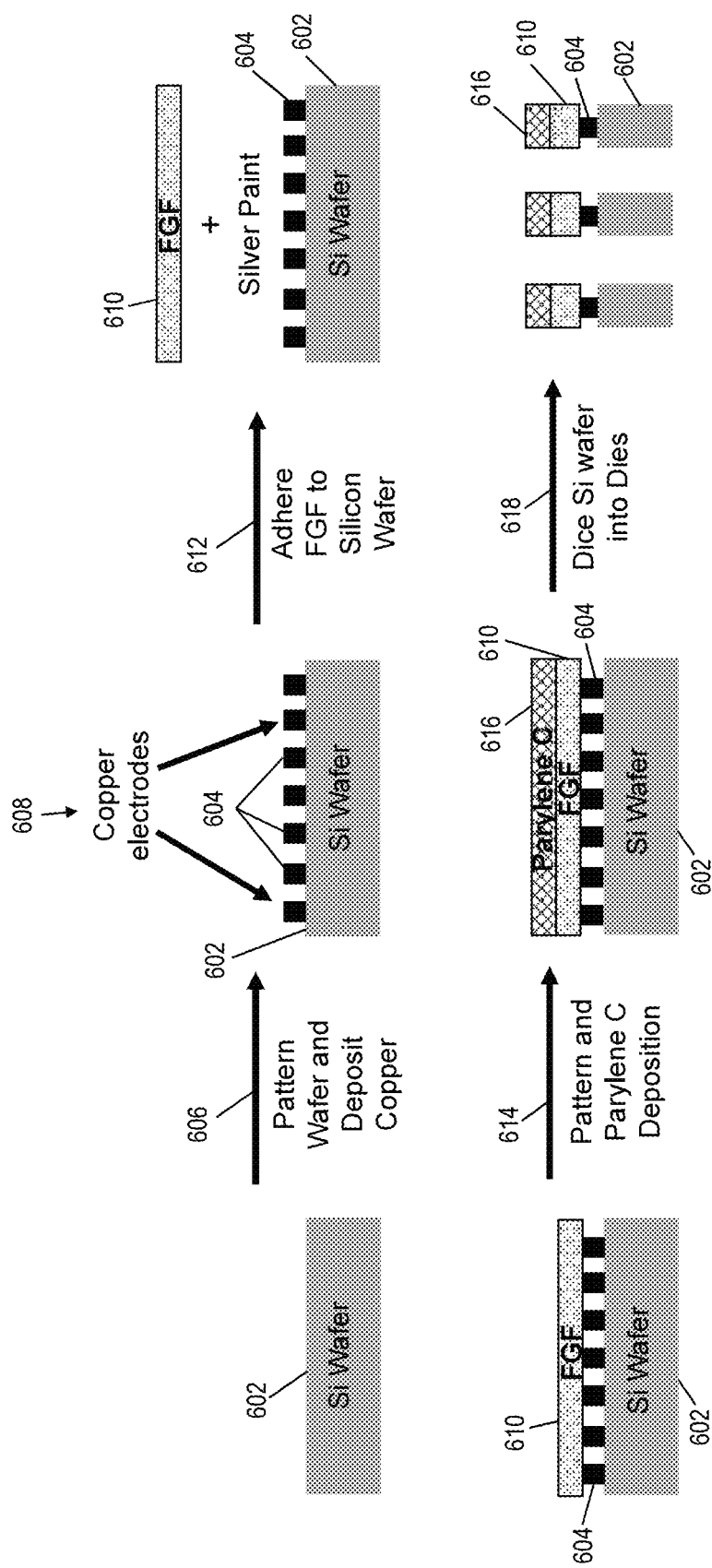
FIG. 6 illustrates an exemplary method for producing a magnetic field sensor using FGF according to aspects of the present disclosure.

FIG. 6 shows an exemplary method for producing a magnetic sensor using FGF. As illustrated, the method of production includes first providing a substrate such as a silicon wafer 602. The wafer 602 is then patterned for conductor traces or electrodes 604 as indicated by arrow 606 and the trace material (e.g., copper) is deposited thereon as shown at 608, which may be deposited through conventional metal deposition techniques (e.g., sputtering or evaporation). Next, FGF material 610 is adhered to the electrodes/traces 606 as indicated by arrow 612. The FGF material 610 may be adhered using a conductive material such as silver paint in one example, but the means of adhering is not limited to such.

After the FGF 610 is adhered to the electrodes 604 and wafer 602, a coating such as Parylene may be applied to patterned areas of the FGF material 610, such as through a chemical vapor deposition process as indicated at arrow 614 and Parylene C layer 616. The Parylene layer 616 provides one or more of electrical insulation, a moisture barrier, and/or protection against corrosion and chemicals. In a final step, the assembly may be cut or diced into separate dies as shown by arrow 618.

Figure 7:
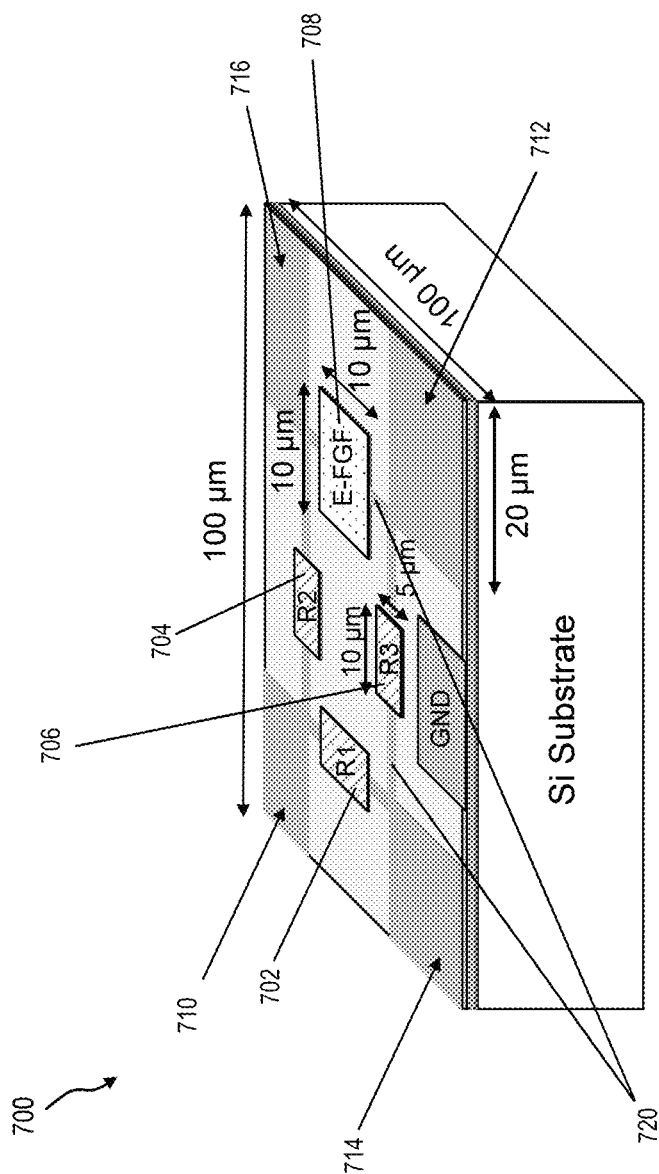
FIG. 7 shows a tri-metric view of an exemplary micro-electro-mechanical systems (MEMS) die embodying at least a portion of the magnetic field sensing apparatus of any of FIGS. 3-5 according to aspects of the present disclosure.

FIG. 7 shows a tri-metric view of an exemplary micro-electro-mechanical systems (MEMS) die or printed circuit board (PCB) sensor 700 embodying at least the sensing portion of the magnetic sensing apparatus of FIGS. 3-5 and the FGF shown assembled in the process of FIG. 6, as examples. Die 700 is shown in this example with approximate dimensions, but these are merely exemplary and are not intended to be limiting. Additionally, the die 700 includes an electrical circuit structure similar to the example of FIG. 3 (or FIG. 5) using a Wheatstone bridge, but other circuit structures are possible such as the circuitry illustrated in FIG. 4, for example.

In the example of FIG. 7, the die 700 includes one or more resistors. In this particular example, a Wheatstone bridge configuration is utilized and three resistors R1, R2, and R3 are disposed on the die 700 (also labeled with reference numbers 702, 704, and 706, respectively). In an aspect, the resistors 702, 704, and 706 may be implemented with thin film tungsten resistors. The die 700 also includes an FGF magnetoresistive element 708, which may correspond to the FGF made by the process shown in FIG. 6, but is not limited to such. Additionally, the FGF element 708 may be encapsulated (or termed herein as an "E-FGF) in a material, such as a thermo-glue or equivalents, that provides encapsulation for negating magnetic field noise, particularly for applications such as EMLs.

The die 700 further includes input/output pads or contacts for coupling input/excitation voltages to and voltage outputs from the die 700. As illustrated in this example, die 700 includes contacts or pads, which are illustrated by pads 710, 712, 714, and 716. According to one example, pad 714 may correspond with node 318, pad 716 with node 320, pad 710 with node 310, and pad 712 with node 316 in the circuit of FIG. 3. Thus, in this particular configuration, an excitation or supply voltage $V_{in}$ is supplied to pad 714 and a ground is coupled to pad 716 (which also may be coupled to a ground node GND illustrated in FIG. 7). Additionally, pads 710 and 712 are output nodes that may be coupled to a low noise differential amplifier (e.g., amplifier 324), which is not shown in FIG. 7.

The die 700 in FIG. 7 may be incorporated into a printed circuit board (PCB) or integrated circuit (IC) package along with an amplifier (e.g., 324, 412, or 524). In some embodiments, the finished IC-package size may be smaller than a dime. Additionally, the use of a Wheatstone bridge configuration provides excellent sensitivity and analog reading in the mV range for accuracy.

Figure 8:
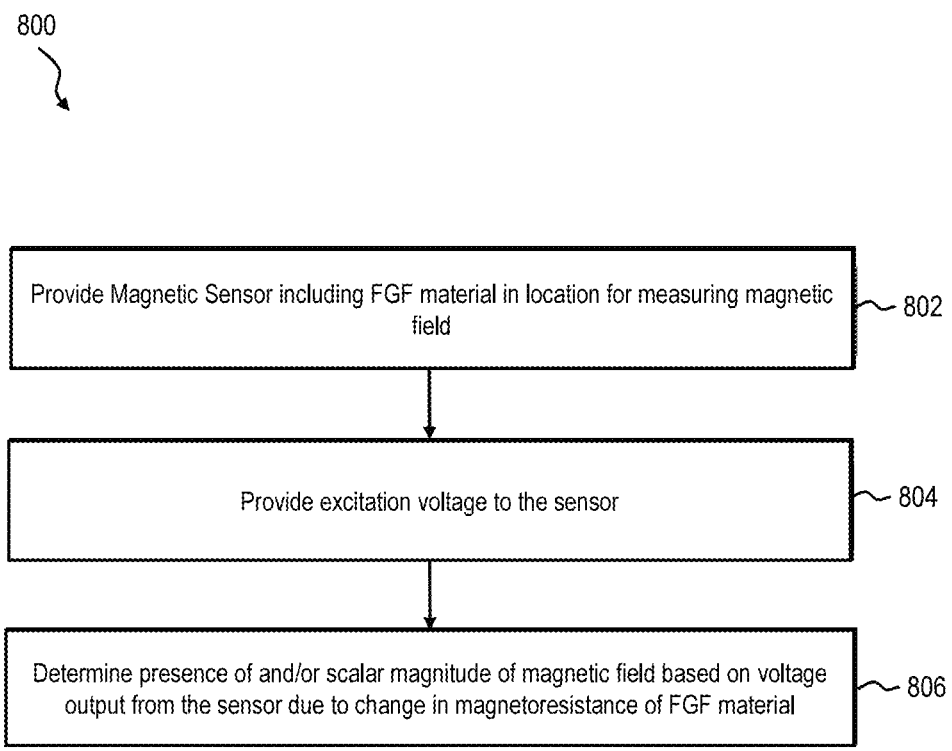
FIG. 8 shows an exemplary method of use for a magnetic field sensor as disclosed herein according to aspects of the present disclosure.

FIG. 8 illustrates an exemplary method 800 for use of the magnetic sensor disclosed herein. As shown, method 800 includes providing a magnetic sensor including FGF material in a location for measuring magnetic field as shown at block 802. Additionally, method 800 includes providing an excitation voltage to the sensor as shown in block 804. Finally, method 800 includes determining the presence and/or scalar magnitude of a magnetic field based on voltage output from the sensor due to change in magnetoresistance of FGF material as shown in block 806.

As will be appreciated from the above description, the present disclosure provides a magnetic field sensor with a linear response of voltage/current with respect to the magnetic field it measures with a low non-linearity percentage. Additionally, this virtually linear response of the sensor is essentially temperature independent as shown by FIG. 2. Accordingly, the presently disclosed magnetic sensor is advantageous over current sensory technology for the metrology of EMLs, for example, as well as for other large magnetic field environments where significant changes in temperatures occur such as with EM Railguns, Electromagnetic Aircraft Launch Systems (EMALS), EM Coil guns, Space-Launchers or Space-Launch assists, Directed Energy Weapons (DEW), and Electronic Warfare (EW), etc.

Other advantages of the presently disclosed magnetic sensor include compactness where the device can be fitted easily within targeted locations within EMLs, a fast response time, and lower costs as no rare-earth materials are needed and the device may be silicon and carbon based. Furthermore, use of the Wheatstone bridge configuration provides a device that is both analog and easily adaptable to existing systems.

Although the invention has been described in detail with reference to certain preferred embodiments, variations and modifications exist within the spirit and scope of the invention as described and defined in the following claims.

The invention claimed is:

1. A magnetic field sensor comprising:
   a resistance network including at least one fluorinated graphene foam (FGF) magnetoresistive device;
   an input configured to couple a voltage source to the resistance network; and
   an output coupled to the resistance network and configured to allow measurement of a voltage drop across at least the at least one FGF magnetoresistive device that can be correlated to at least one of a presence of a magnetic field or a scalar magnitude value of the magnetic field.

2. The magnetic field sensor of claim 1, a resistance network including:
   a first FGF magnetoresistive device and a second FGF magnetoresistive device coupled in series at a first node;
   a third FGF magnetoresistive device and a fourth FGF magnetoresistive device coupled in series at a second node;
   wherein the first and second FGF magnetoresistive devices in series are coupled in parallel with the third and fourth FGF magnetoresistive devices at third and fourth nodes, the input is configured to couple the voltage source across the third and fourth nodes, and the first and second nodes are coupled to the output.

3. The magnetic field sensor of claim 1, further comprising:
   a printed circuit board (PCB), wherein the first resistance and the FGF are disposed on or placed within the PCB.

4. The magnetic field sensor of claim 1, further comprising:
   the output including an amplifier to amplify the voltage drop across the at least one FGF magnetoresistive device, wherein the voltage drop correlates to the scalar magnitude value of the magnetic field due to changes in the resistivity of the at least one FGF when placed in the magnetic field.

5. The magnetic field sensor of claim 1, further comprising:
   a magnetic field source disposed in proximity to the at least one FGF magnetoresistive device and providing a secondary magnetic field oriented parallel to at least one or more of x, y, and z Cartesian coordinates for allowing a determination of a vector quantity of the magnetic field.

6. The magnetic field sensor of claim 5, wherein the secondary magnetic field has a value less than the magnetic field being measured.

7. A magnetic field sensor comprising:
   a resistance network including:
   a first resistance and a second resistance coupled in series at a first node;
   a third resistance and a fluorinated graphene foam (FGF) coupled in series at a second node;
   wherein the first and second resistances in series are coupled in parallel with the third resistance and the FGF in series at third and fourth nodes;
   an input configured to couple a voltage source across the third and fourth nodes; and
   an output coupling configured to couple the first and second nodes to an output.

8. The magnetic field sensor of claim 7, further comprising;
a die, wherein the first, second, and third resistances and the FGF are disposed on or placed within the die.

9. The magnetic field sensor of claim 7, further comprising:
a differential amplifier coupled to the output to amplify voltage differences between the first and second nodes of the Wheatstone bridge, wherein the voltage differences correlate to the intensity of a magnetic field due to changes in the resistivity of the FGF when placed in a magnetic field.

10. The magnetic field sensor of claim 9, further comprising;
a printed circuit board (PCB), wherein the die and the differential amplifier are disposed on or placed within the PCB.

11. The magnetic field sensor of claim 7, further comprising;
a differential amplifier coupled to the output to amplify voltage differences between the first and second nodes of the Wheatstone bridge, wherein the voltage differences correlate to the intensity of a magnetic field due to changes in the resistivity of the FGF when placed in a magnetic field; and
a printed circuit board (PCB), wherein the first, second, and third resistances, the FGF, and the differential amplifier are disposed on or placed within the PCB.

12. The magnetic field sensor of claim 7, further comprising:
a voltage source, wherein the voltage source is coupled across the third and fourth nodes.

13. The magnetic field sensor of claim 7, wherein the FGF is encapsulated in thermo-glue.

14. The magnetic field sensor of claim 4, wherein a magnetoresistance of the FGF is a scalar value that changes with respect to changes in the magnetic field without regard to a vector direction of the magnetic field.

15. The magnetic field sensor of claim 4, further comprising:
a magnetic field source disposed in proximity to the FGF and providing a secondary magnetic field oriented parallel or at any angle with respect to the magnetic field chosen by design to at least one or more of x, y, and z Cartesian coordinates for allowing a determination of a vector quantity of the magnetic field.

16. The magnetic field sensor of claim 15, wherein the secondary magnetic field has a value less than the magnetic field being measured.

* * * * *